(12) United States Patent
Lu et al.

(10) Patent No.: US 6,269,017 B1
(45) Date of Patent: Jul. 31, 2001

(54) MULTI LEVEL MASK ROM WITH SINGLE CURRENT PATH

(75) Inventors: Tao-Cheng Lu, Kaohsiung; Chung Ju Chen; Mam-Tsung Wang, both of Hsin-Chu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/262,374

(22) Filed: Mar. 4, 1999

(51) Int. Cl.[7] ........................... G11C 17/10; H01L 27/112
(52) U.S. Cl. ............................................. 365/104; 257/391
(58) Field of Search ..................................... 257/390, 391; 365/104

(56) References Cited

U.S. PATENT DOCUMENTS

| | | |
|---|---|---|
| 5,053,648 | 10/1991 | va den Elshout et al. . |
| 5,241,497 | 8/1993 | Komarek . |
| 5,262,984 | 11/1993 | Noguchi et al. . |
| 5,268,861 | 12/1993 | Hotta . |
| 5,295,092 | 3/1994 | Hotta . |
| 5,341,337 | 8/1994 | Hotta . |
| 5,394,371 | * 2/1995 | Hotta ..................................... 365/104 |
| 5,506,813 | 4/1996 | Mochizuki et al. . |
| 5,852,570 | * 12/1998 | Hotta et al. ........................... 365/104 |
| 6,018,487 | * 1/2000 | Lee et al. .............................. 365/104 |

FOREIGN PATENT DOCUMENTS

| | | |
|---|---|---|
| 3842511 | 6/1989 | (DE) . |
| 109854 | 5/1984 | (EP) . |
| 424964 | 5/1991 | (EP) . |
| 0 880 144 | 11/1998 | (EP) . |
| 10050079 | 2/1998 | (JP) . |

OTHER PUBLICATIONS

16Mb ROM Design Using Bank Select Architecture, Mikiro Okada, et al., Integrated Circuits Group, Sharp Corporation, pp. 85–86.

A Four–State ROM Using Multilevel Process Technology, David A. Rich, et al., IEEE Journal of Solid–State Circuits, vol. SC–19, No. 2, Apr. 1984, pp. 174–179.

* cited by examiner

*Primary Examiner*—Gene M. Munson
(74) *Attorney, Agent, or Firm*—Mark A. Haynes; Haynes & Beffel LLP

(57) ABSTRACT

Mask ROMS with fixed code implantation and associated integrated circuits are described. An integrated circuit has a Mask ROM including: an array of memory cells including a first bank of memory cells and a second bank of memory cells, and the first bank of memory cells separated from the second bank of memory cell by a set of select lines, and the first bank of memory cells and the second bank of memory cells includes at least one fixed code implanted memory cell column. The use of fixed code implantation results in a single current path during the reading of a given memory cell and permits the size of the corresponding device to be reduced and have better topography. The Mask ROM provides additional advantages because the use of the same select transistors for two banks reduces the overhead of select transistors for a given size of array, the use of only one sense amplifier per block reduces the overhead of sense amplifiers for a given size of array, and the use of odd and even word line decoders divides the memory cell array into a number of banks.

14 Claims, 3 Drawing Sheets

MULTI LEVEL MASK ROM WITH SINGLE CURRENT PATH

BACKGROUND OF THE INVENTION

1. Field of the Invention

The invention relates generally to the field of microelectronic read-only memory (ROM). More particularly, the invention relates to the field of multilevel Mask ROM.

2. Discussion of the Related Art

Conventional Mask ROMs have recently been multilevel programmed. Multilevel programming permits more data to be stored per memory cell by defining more than two (e.g., 4) memory cell states. Each of these states is defined by a different voltage threshold, which is a function of the amount of dopant implanted into the channel of a given memory cell during mask programming. The difference in multi-level thresholds may be less than one volt. Such a sub-volt difference in multi-level thresholds can be necessitated by the operating voltage of the Mask ROM (e.g., 3 V).

A problem with this technology has been that the sub-volt threshold difference tends to cause read errors. The narrow difference between voltage thresholds requires a sensitive system that is, in-turn, sensitive to even small current leakages. Current leakage can cause the associated sense amplifier to report an incorrect value for the data being read from a memory cell of interest. Therefore, what is required is a solution that reduces multi-level Mask ROM read errors by controlling current leakage.

SUMMARY OF THE INVENTION

A primary object of the invention is to provide fixed code implantation for isolating blocks of memory cells, thereby defining a single current path during a memory cell read operation. Fixed code isolation consumes only a small area and provides good topography.

An optional object of the invention is to provide a Mask ROM that uses the same select transistors for two banks of memory cells, thereby reducing select transistor overhead. Another optional object of the invention is to provide a Mask ROM having only one sense amplifier per block, thereby reducing sense amplifier overhead. Another optional object of the invention is to provide a Mask ROM having odd and even word line decoders, thereby dividing the memory cell array into a plurality of banks.

A first aspect of the invention is implemented in an embodiment that is based on a Mask ROM comprising: an array of memory cells including a first bank of memory cells and a second bank of memory cells, and the first bank of memory cells separated from the second bank of memory cell by a set of select lines, wherein the first bank of memory cells and the second bank of memory cells includes at least one fixed code implanted memory cell column. A second aspect of the invention is implemented in an embodiment that is based on a method of reading data from a Mask ROM memory cell comprising: utilizing the Mask ROM. A third aspect of the invention is implemented in an embodiment that is based on an integrated circuit that includes the Mask ROM.

These, and other, objects and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted that the features illustrated in the drawings are not necessarily drawn to scale.

DESCRIPTION OF PREFERRED EMBODIMENTS

Figure 1:
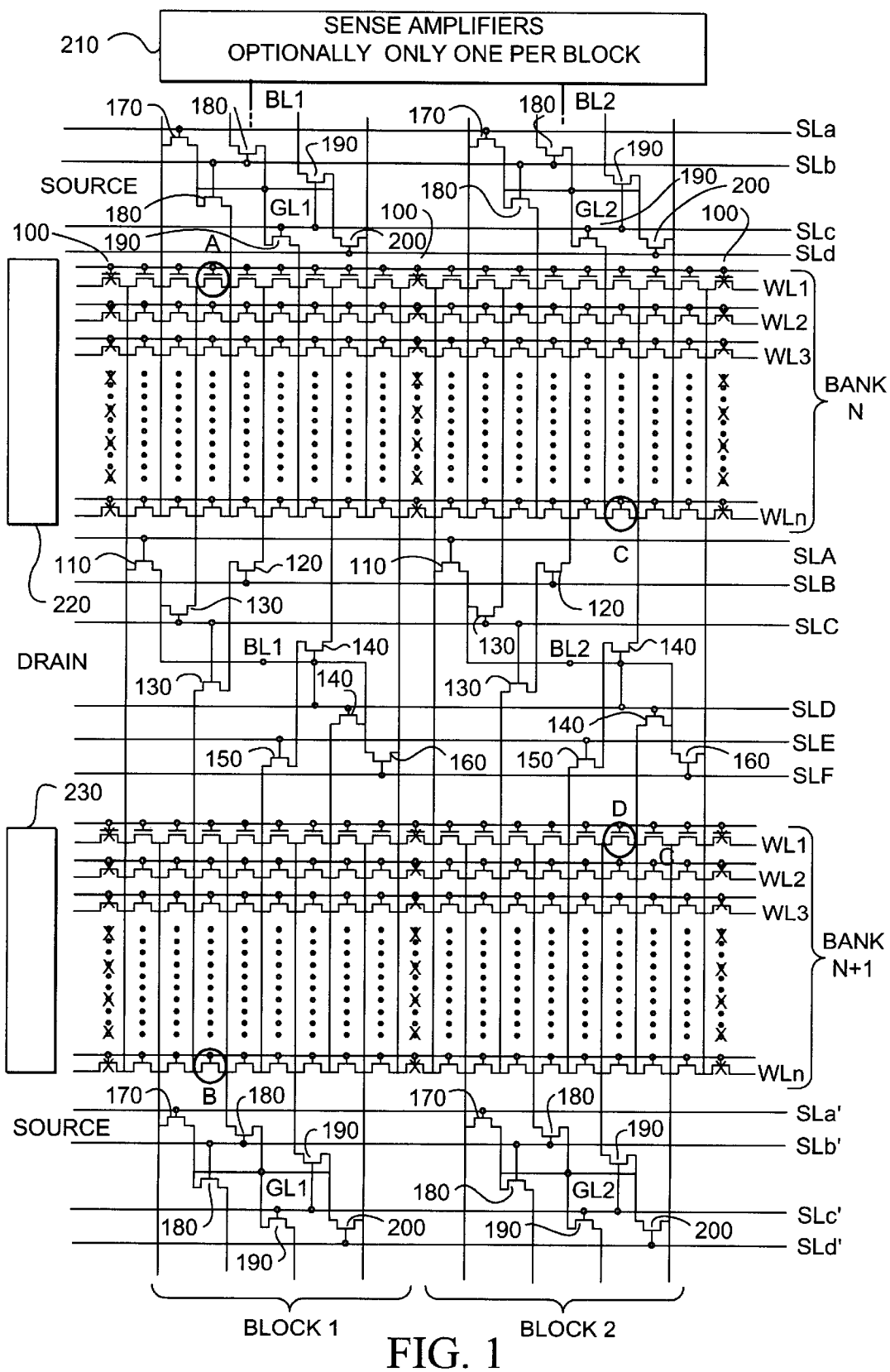
FIG. 1 illustrates a circuit schematic of a portion of a multilevel Mask ROM, representing an embodiment of the invention.

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail.

The context of the invention includes integrated circuits that have multilevel Mask ROM. The context of the invention also includes semiconductor substrates upon which the components of the multilevel Mask ROM are fabricated.

The invention includes a multilevel Mask ROM having memory cells that compose a memory cell array structure. The array structure defines a plurality of memory cell banks. Each of these memory cell banks is separated from its adjacent memory cell banks by two sets of select lines. Thus, these memory cell banks can be termed "horizontally arranged." The array structure also defines a plurality of memory cell blocks. Each block includes a plurality of columns of memory cells adapted to store data (e.g., eight columns). Thus, these memory cell blocks can be termed "vertically arranged."

The invention includes providing each of the memory cell blocks with (at least) one column of fixed implanted code memory cells to provide electrical isolation of the blocks. These memory cells can be implanted by introducing dopant atoms into the associated memory cell channels with readily commercially available ion implantation equipment. To be completely effective, the level of implantation should raise the threshold voltage of the memory cell channels above the operational voltage of the Mask ROM, or at least above the highest read voltage. In this way, when data from a non-fixed code implanted memory cell is being read, there is only a single current path.

The invention can include the use of the same select transistors for two different memory cell banks. A given set of select lines, which are located between two adjacent banks of memory cells, can be used to functionally activate the sub-bit lines (or subground lines) in both of the adjacent banks of memory cells. In more detail, a given set of select lines will be adapted to functionally activate either sub-bit lines or subground lines. In either case, each select line among the set of select lines causes a pair of transistors to become conductive so that both a subline to the first bank and a subline to the second bank are functionally actuated. A given cell in a particular bank of interest can be read by actuating the corresponding select line in a second set of select lines that is separated from the first set of select lines by the bank of interest. In this way, each set of select lines is being used to address the memory cells in two banks.

The invention also can include using only one sense amplifier per memory cell block. Using only one sense amplifier per memory cell block reduces the sense amplifier overhead (i.e., more memory cells are serviced per sense amplifier compared to the prior art).

The invention can also include using odd and even wordline decoders. The division of the memory cell array into multiple banks permits the use of odd and even wordline decoders.

EXAMPLE

A specific embodiment of the invention will now be further described by the following, nonlimiting example which will serve to illustrate in some detail various features of significance. The example is intended merely to facilitate an understanding of ways in which the invention may be practiced and to further enable those of skill in the art to practice the invention. Accordingly, the example should not be construed as limiting the scope of the invention.

gates of select transistors 130 are coupled to select line SLC. The gates of select transistors 140 are coupled to select line SLD. The gates of select transistors 150 are coupled to select line SLE. The gates of select transistors 160 are coupled to select line SLF. A set of select transistors 170–200 are shared between both bank N and an adjoining bank (not shown) and bank N+1 and another adjoining bank (not shown) for providing source bias. The gates of select transistors 170 are coupled to select line SLa1. The gates of select transistors 180 are coupled to select line SLb1. The gates of select transistors 190 are coupled to select line SLc1. The gates of select transistors 200 are coupled to select line SLd1. It can be appreciated that alternating sets of select lines are repeated throughout the larger array structure. In this way, the drains of the transistors that compose the memory cells in block 1 are coupled to a first bit line BL1 and the sources of the transistors that compose the memory cells in block 1 are coupled to a first ground line GL1. Similarly, the drains of the transistors that compose the memory cells in block 2 are coupled to a second bitline BL2 and the sources of the transistors that compose the memory cells in block 2 are coupled to a second groundline GL2. The columns of memory cells that compose the blocks of memory cells are separated from one another by alternating sub-bit lines and sub-ground lines.

Figure 2:
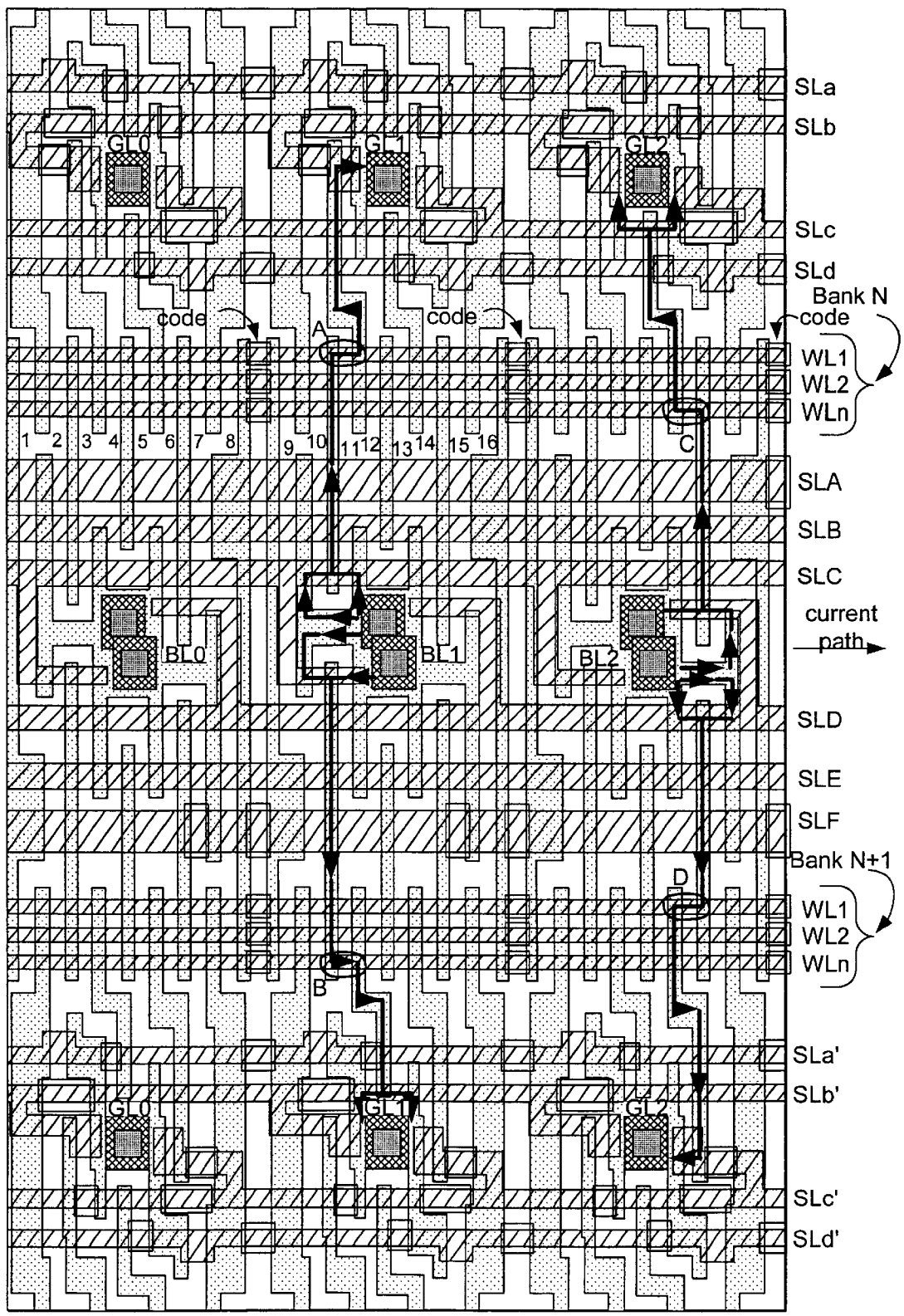
FIG. 2 illustrates a structural schematic of the portion of the multilevel Mask ROM shown in FIG. 1.
Figure 3:
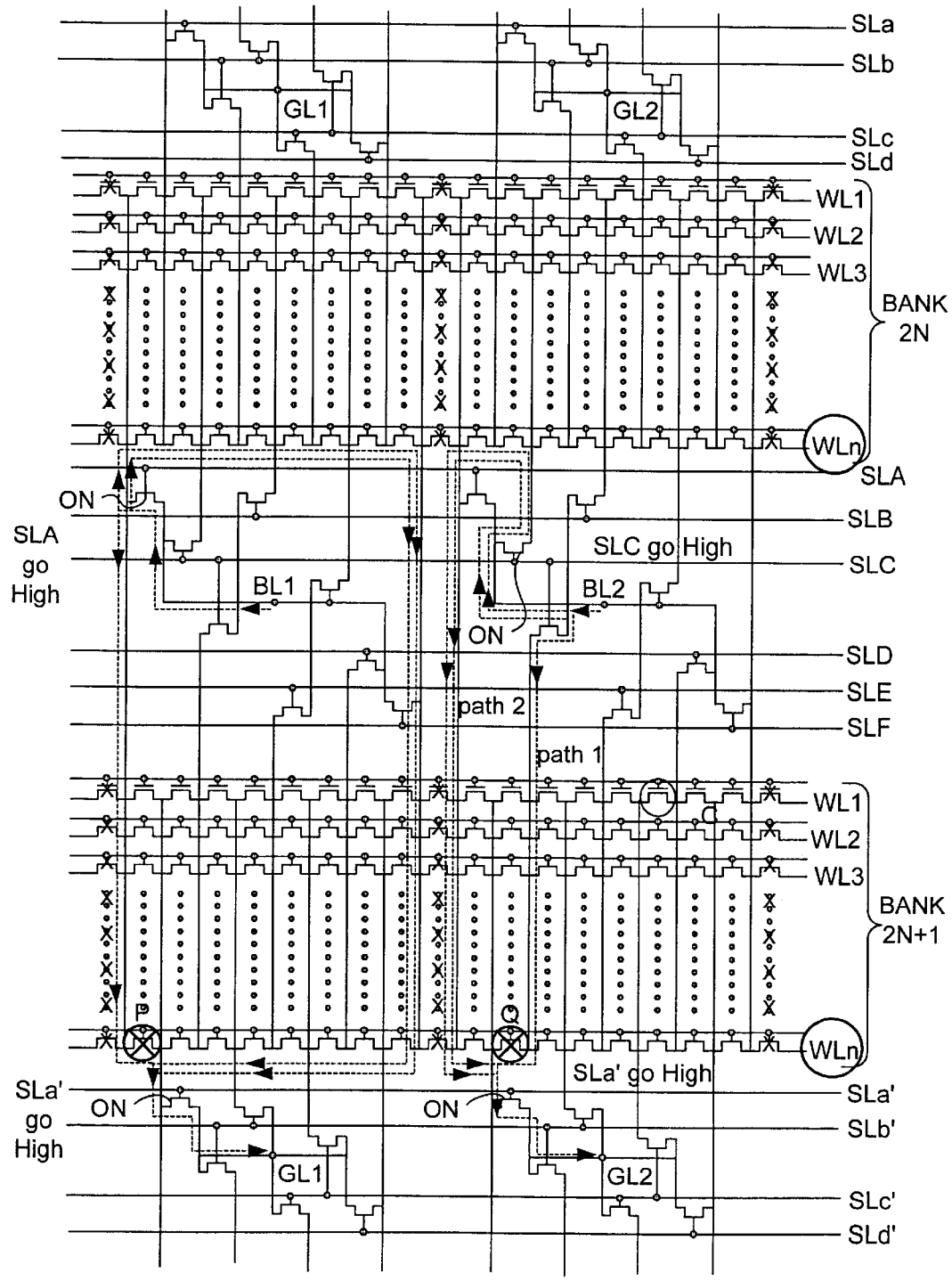
FIG. 3 illustrates an operational view of the portion of the multilevel Mask ROM shown in FIGS. 1–2.

The operating principles of the circuit depicted in FIGS. 1–3 are described by Table 1.

TABLE 1

| | Conductor States | | | | | | | | | |
|---|---|---|---|---|---|---|---|---|---|---|
| Read Cell | BL1/GL1 | BL2/GL2 | SLC | SLD | WL1 | WLn | SLb | SLb' | SLc | SLc' |
| A | On | off | On | Off | On | off | on | Off | off | off |
| B | On | off | On | Off | Off | on | off | On | off | off |
| C | Off | on | Off | On | Off | on | off | Off | on | off |
| D | Off | on | Off | On | On | off | off | Off | off | On |

Referring to the drawings, an exemplary embodiment of the invention is depicted in FIGS. 1–3. FIGS. 1–3 illustrate the memory cell banks, the memory cell blocks, and the fixed code implanted cell columns of the invention. FIGS. 1–3 also illustrate wordlines, sub-groundlines, sub-bitlines, select transistors, select lines, groundlines, and bitlines. The exemplary embodiment achieves separation by coding (dopant implanting) a column of cells to a threshold of about 4 volts (for operation at approximately 2.8 volts).

Referring to FIG. 1, the whole memory is divided into multiple banks. The memory cell array structure (not all of which is shown) includes a bank N and a bank N+1. The memory cell array structure also includes a block 1 and a block 2. It can be appreciated that bank N and bank N+1 are depicted in FIG. 1 as horizontally arranged subcomponents of the larger array structure, while block 1 and block 2 are depicted as vertically arranged subcomponents of the larger array structure. Bank N includes a plurality of wordlines WL1–WLn. Similarly, bank N+1 includes another plurality of wordlines WL1–WLn. Each of block 1 and block 2 includes 8 columns of memory cells which is accompanied by a column of fixed code cells 100 for isolation. A set of select transistors 110–160 are shared between bank N and bank N+1 for providing drain bias. The gates of select transistors 110 are coupled to select line SLA. The gates of select transistors 120 are coupled to select line SLB. The In the depicted embodiment, fixed code implantation is used as isolation for every 8 memory cells. However, the invention is in no way limited to one column of fixed code implantation per 8 columns of usable memory cells. The invention is equally applicable to embodiments where there are fewer (e.g., 4 or 2) or more (e.g., 16, or 32) columns of usable memory cells per column of fixed code implant. In this embodiment, the same select transistors are used for two memory cell banks to reduce the overhead of select transistors. In this embodiment, only one sense amplifier 210 is used for each memory cell block. In this embodiment, an odd wordline decoder 220 is coupled to bank N and an even wordline decoder 230 is coupled to bank N+1.

The operational power voltage for this embodiment is approximately 3V and the threshold that results from the fixed code implantation for isolation can be correspondingly low (e.g. approximately 4 volts). In preferred embodiments of the invention, the threshold that results from the fixed code should be higher than the operational power voltage. More specifically, in this embodiment, the threshold voltages for the multilevel structure are defined as 0.8v, 1.5V, 2.2V, and 4V for 2.8V operation.

In the depicted embodiment, every block includes 8 columns of cells, which are accompanied by 1 column of fixed code cells for isolation. The fixed code is clearly represented by the notation "x".

Referring to FIG. 2, a physical layout corresponding to the circuit shown in FIG. 1 is depicted. Again, the memory cell array structure is divided into multiple memory cell banks, each of which is divided into multiple memory cell blocks. Two such memory cell blocks are labeled in Bank N (i.e., 1–8 plus code; and 9–16 plus code). Two current paths are indicated with an arrow. The term block, as used herein, can refer to the memory cells that compose a horizontally delimited set of memory cell columns within a single bank, or alternatively, the memory cells that compose a horizontally delimited set of memory cell columns in two, or more, banks. In the latter case, the term bank describes a structure that extends across at least two banks, albeit interrupted by select lines.

Referring to FIG. 3, together, bank N and bank N+1 compose a merged bank structure. Even and odd wordline decoder circuits (not shown) in FIG. 3 are used for the word lines WL1–WLn in bank N and bank N+1. In this case, a neighboring bank needs to use a different wordline decoder to eliminate the leakage path. For example, to read cell Q, both SLC and SLa' go high. Then current may flow from the second bitline BL2 along path 1 to GL2, if the read voltage exceeds the threshold voltage of cell Q. However, if both WLn of bank 2N and bank 2N+1 are high, leakage current may flow along path 2. Similar conditions may occur when other cells are read, such as cell P, as shown in FIG. 3. Therefore, the exemplary embodiment should use even and odd wordline decoder circuits for bank 2N and bank 2N+1 respectively. One of the even and odd wordline decoder circuits energizes the bank 2N wordline WLn. The other of these two wordline decoder circuits energizes the bank 2N+1 wordline WLn. In this way, when either of memory cell Q or P are being read, the memory cells in bank 2N whose gates are in wordline WLn will be in their normally nonconductive state. It can be appreciated that the even and odd wordline decoder circuits can energize wordlines in more than just one bank. For example, even or odd wordline decoder circuit that energizes the wordlines of bank 2N can also (and optionally simultaneously) energize the wordlines of other banks such as, for example, bank 2N+2 (not shown), bank 2N+4 (not shown), and bank 2N+6 (not shown), etc.

Advantages of the Invention

A Mask ROM, representing an embodiment of the invention, can be cost effective and advantageous for at least the following reasons. The use of fixed code implantation limits the number of current paths during a step of reading data from a memory cell in a Mask ROM to a singularity, thereby controlling current leakage and reducing the frequency of read errors. Also, the use of fixed code implantation provides smaller size and better topography compared to other current path limiting approaches. The use of the same select transistors for two banks of memory cells reduces the overhead of select transistors for a given size of memory cell bank. The use of only one sense amplifier per block reduces the overhead of sense amplifiers per memory cell block. The use of odd and even wordline decoders permits the use of the merged bank structure.

It will be manifest that various additions, modifications and rearrangements of the features of the invention may be made without deviating from the spirit and scope of the underlying inventive concept.

What is claimed is:

1. A Mask Read-Only Memory (ROM), comprising: an array of memory cells including a first bank of memory cells and a second bank of memory cells, and the first bank of memory cells separated from the second bank of memory cells by a set of select lines, wherein a first select line of the set of select lines is coupled to a first gate of a first transistor and a second gate of a second transistor, the first transistor is coupled to the first bank of memory cells, and the second transistor is coupled to the second bank of memory cells, and wherein the first bank of memory cells and the second bank of memory cells includes at least one fixed code implanted memory cell column, and wherein a first terminal of the first transistor is coupled to the first bank of memory cells via a first sub-bit line, a second terminal of the first transistor is coupled to a bit line, a first terminal of the second transistor is coupled to the second bank of memory cells via a second sub-bit line, and a second terminal of the second transistor is coupled to the bit line.

2. The Mask ROM of claim 1, wherein the first terminal of the first transistor is a source, the second terminal of the first transistor is a drain, the first terminal of the second transistor is a source, and the second terminal of the second transistor is a drain.

3. The Mask ROM of claim 1, further comprising a first wordline decoder circuit coupled to the first bank of memory cells and a second wordline decoder circuit coupled to the second bank of memory cells.

4. A Mask Read-Only Memory (ROM), comprising: an array of memory cells including a first bank of memory cells and a second bank of memory cells, and the first bank of memory cells separated from the second bank of memory cells by a set of select lines;

wherein a first select line of the set of select lines is coupled to a first gate of a first transistor and a second gate of a second transistor, the first transistor is coupled to the first bank of memory cells, and the second transistor is coupled to the second bank of memory cells, wherein the first bank of memory cells and the second bank of memory cells includes at least one fixed code implanted memory cell column, and wherein a first terminal of the first transistor is coupled to the first bank of memory cells via a first sub-ground line, a second terminal of the first transistor is coupled to a ground line, a first terminal of the second transistor is coupled to the second bank of memory cells via a second sub-bit line, and a second terminal of the second transistor is coupled to the ground line.

5. The Mask ROM of claim 4, wherein the first terminal of the first transistor is a drain, the second terminal of the first transistor is a source, the first terminal of the second transistor is a drain, and the second terminal of the second transistor is a source.

6. The Mask ROM of claim 5, further comprising an odd wordline decoder coupled to the first bank of memory cells and an even wordline decoder coupled to the second bank of memory cells.

7. A Mask Read-Only Memory (ROM), comprising: an array of memory cells including a first bank of memory cells and a second bank of memory cells, and the first bank of memory cells separated from the second bank of memory cells by a set of select lines;

wherein a first select line of the set of select lines is coupled to a first gate of a first transistor and a second gate of a second transistor, the first transistor is coupled to the first bank of memory cells, and the second transistor is coupled to the second bank of memory cells, wherein the first bank of memory cells and the second bank of memory cells includes at least one fixed code implanted memory cell column, and wherein the array of memory cells includes a first block of memory cells and a second block of memory cells, and the first block of memory cells is separated from the second block of memory cells by the at least one fixed code implanted memory cell column, and further comprising only one sense amplifier coupled to the first block of memory cells and only one sense amplifier coupled to the second block of memory cells.

8. An integrated circuit, comprising a Mask Read-Only Memory (ROM), including:

an array of memory cells including a first bank of memory cells and a second bank of memory cells, and the first bank of memory cells separated from the second bank of memory cells by a set of select lines, wherein a first select line of the set of select lines is coupled to a first gate of a first transistor and a second gate of a second transistor, the first transistor is coupled to the first bank of memory cells, and the second transistor is coupled to the second bank of memory cells, and wherein the first bank of memory cells and the second bank of memory cells includes at least one fixed code implanted memory cell column, and wherein a first terminal of the first transistor is coupled to the first bank of memory cells via a first sub-bit line, a second terminal of the first transistor is coupled to a bit line, a first terminal of the second transistor is coupled to the second bank of memory cells via a second sub-bit line, and a second terminal of the second transistor is coupled to the bit line.

9. The integrated circuit of claim 8, wherein the first terminal of the first transistor is a source, the second terminal of the first transistor is a drain, the first terminal of the second transistor is a source, and the second terminal of the second transistor is a drain.

10. The Mask ROM of claim 8, further comprising a first wordline decoder circuit coupled to the first bank of memory cells and a second wordline decoder circuit coupled to the second bank of memory cells.

11. An integrated circuit, comprising a Mask Read-Only Memory (ROM), including:

an array of memory cells including a first bank of memory cells and a second bank of memory cells, and the first bank of memory cells separated from the second bank of memory cells by a set of select lines, wherein a first select line of the set of select lines is coupled to a first gate of a first transistor and a second gate of a second transistor, the first transistor is coupled to the first bank of memory cells, and the second transistor is coupled to the second bank of memory cells, wherein the first bank of memory cells and the second bank of memory cells includes at least one fixed code implanted memory cell column, and wherein a first terminal of the first transistor is coupled to the first bank of memory cells via a first sub-ground line, a second terminal of the first transistor is coupled to a ground line, a first terminal of the second transistor is coupled to the second bank of memory cells via a second sub-bit line, and a second terminal of the second transistor is coupled to the ground line.

12. The integrated circuit of claim 11, wherein the first terminal of the first transistor is a drain, the second terminal of the first transistor is a source, the first terminal of the second transistor is a drain, and the second terminal of the second transistor is a source.

13. The integrated circuit of claim 12, further comprising an odd wordline decoder coupled to the first bank of memory cells and an even wordline decoder coupled to the second bank of memory cells.

14. An integrated circuit, comprising a Mask Read-Only Memory (ROM), including:

an array of memory cells including a first bank of memory cells and a second bank of memory cells, and the first bank of memory cells separated from the second bank of memory cells by a set of select lines, wherein a first select line of the set of select lines is coupled to a first gate of a first transistor and a second gate of a second transistor, the first transistor is coupled to the first bank of memory cells, and the second transistor is coupled to the second bank of memory cells, wherein the first bank of memory cells and the second bank of memory cells includes at least one fixed code implanted memory cell column, and wherein the array of memory cells includes a first block of memory cells and a second block of memory cells, and the first block of memory cells is separated from the second block of memory cells by the at least one fixed code implanted memory cell column, and further comprising only one sense amplifier coupled to the first block of memory cells and only one sense amplifier coupled to the second block of memory cells.

* * * * *